(12) United States Patent
Oladeji et al.

(10) Patent No.: US 7,776,705 B2
(45) Date of Patent: Aug. 17, 2010

(54) METHOD FOR FABRICATING A THICK COPPER LINE AND COPPER INDUCTOR RESULTING THEREFROM

(75) Inventors: Isaiah O. Oladeji, Gotha, FL (US); Alan Cuthbertson, Newcastle upon Tyne (GB)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/470,552

(22) Filed: Sep. 6, 2006

(65) Prior Publication Data

US 2008/0057658 A1  Mar. 6, 2008

(51) Int. Cl.
*H01L 21/20* (2006.01)
(52) U.S. Cl. .................................... 438/381
(58) Field of Classification Search ............ 438/238, 438/381; 257/531
See application file for complete search history.

(56) References Cited

U.S. PATENT DOCUMENTS

| | | | |
|---|---|---|---|
| 5,450,263 A * | 9/1995 | Desaigoudar et al. | 360/110 |
| 5,478,773 A | 12/1995 | Dow et al. | |
| 5,541,135 A | 7/1996 | Pfeifer et al. | |
| 6,008,102 A | 12/1999 | Alford et al. | |
| 6,444,517 B1 | 9/2002 | Hsu et al. | |
| 6,790,773 B1 * | 9/2004 | Drewery et al. | 438/643 |
| 6,803,323 B2 * | 10/2004 | Ramanathan et al. | 438/745 |
| 6,939,791 B2 * | 9/2005 | Geffken et al. | 438/622 |
| 6,998,321 B2 * | 2/2006 | Park | 438/381 |
| 7,074,721 B2 * | 7/2006 | Wang | 438/706 |
| 7,153,774 B2 * | 12/2006 | Hau-Riege et al. | 438/687 |
| 2003/0109118 A1 * | 6/2003 | Ott et al. | 438/531 |
| 2003/0234437 A1 | 12/2003 | Yamamoto et al. | |
| 2005/0142793 A1 | 6/2005 | Choi | |

OTHER PUBLICATIONS

Lin, Chern-Sheng "Automatic inspection in photoresist development processing with a partial area-imaging device" Mat. Sci. in Semi. Proc. vol. 10 Iss. 6 Dec. 2007 pp. 227-234.*
Lin, Kuang-Peng "A Study of Implant Damage Induced Thin Oxide Film Expansion During Photoresist Dry Etching" Reliability Physics Symposium, 2000, Proc. 38th Ann. 2000 IEEE Int. pp. 404-406.*
U.S. Appl. No. 11/618,240 (incl. drawings), "Methods and Compositions for Wet Etching", filed Aug. 21, 2006, Assignee: Atmel Corporation, Inventor: Isaiah O. Oladeji et al.

* cited by examiner

*Primary Examiner*—N Drew Richards
*Assistant Examiner*—Grant S Withers
(74) *Attorney, Agent, or Firm*—Schwegman, Lundberg & Woessner, P.A.

(57) ABSTRACT

A method of forming one or more inductors on a substrate is disclosed. The method includes forming a first dielectric material over the substrate, forming a trench in the first dielectric material, and substantially filling the trench with copper to form the one or more inductors. The first dielectric material is removed and a second dielectric material is formed over the copper. The second dielectric material is removed from an uppermost portion of the copper, thus leaving a portion of the second dielectric material on the sidewalls of the copper.

14 Claims, 7 Drawing Sheets

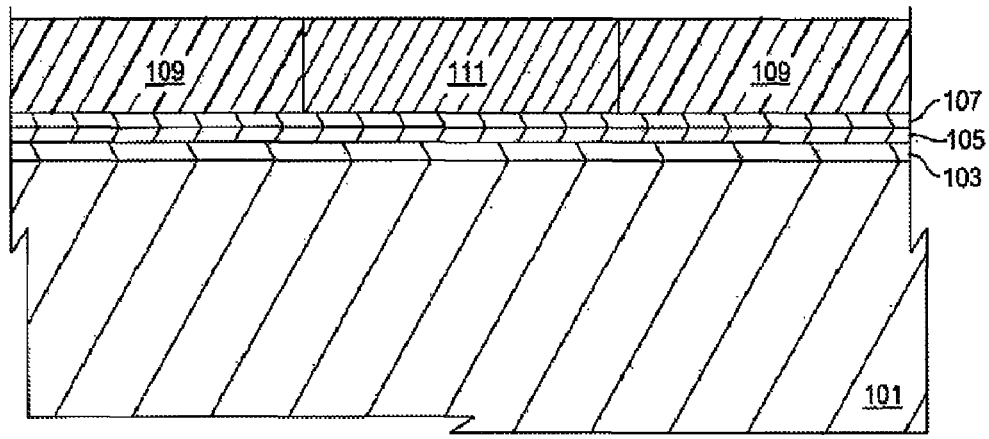
Fig._1 (Prior Art)
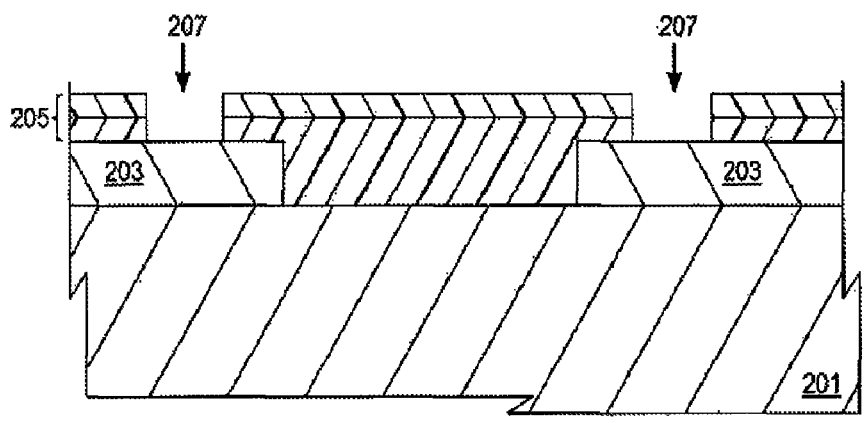
Fig._2A
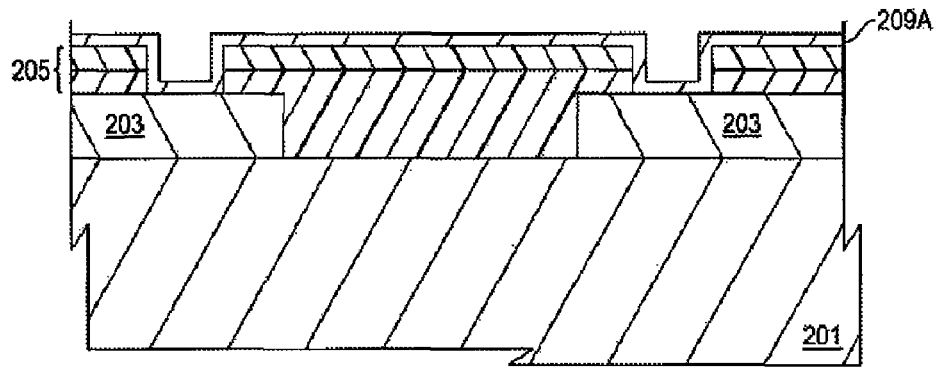
Fig._2B

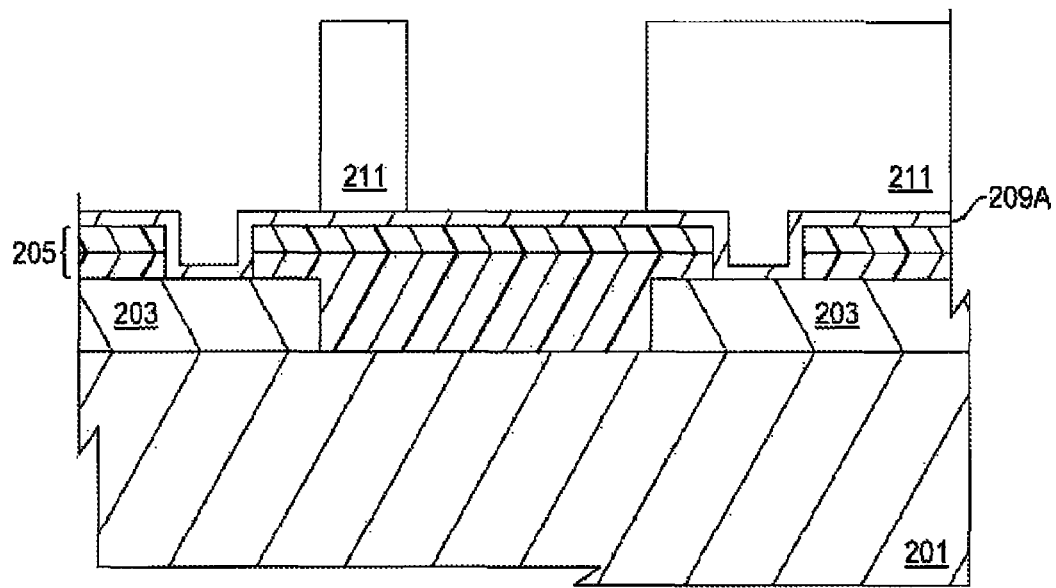
Fig._2C
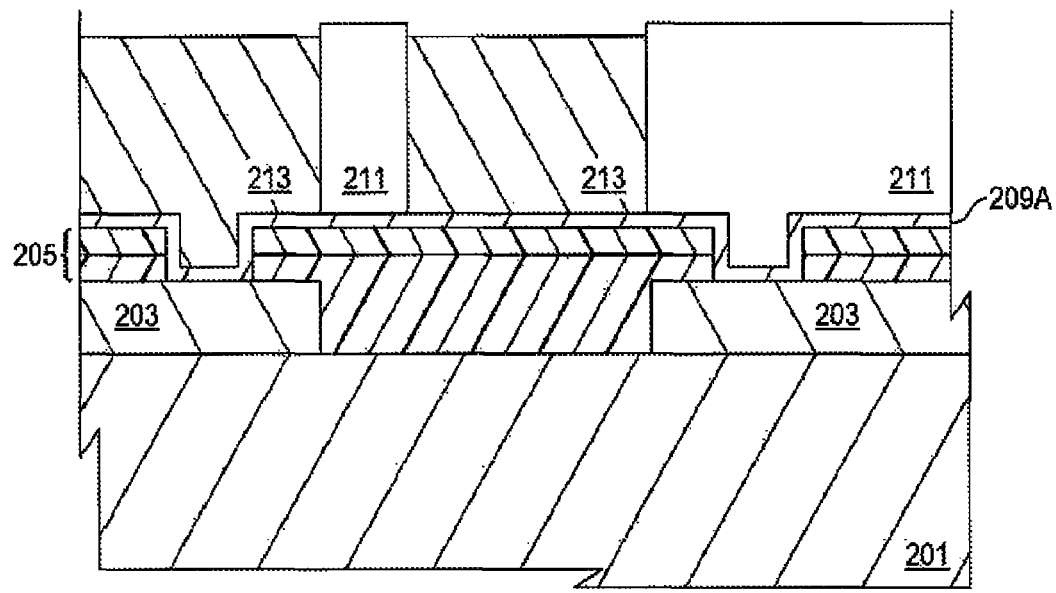
Fig._2D

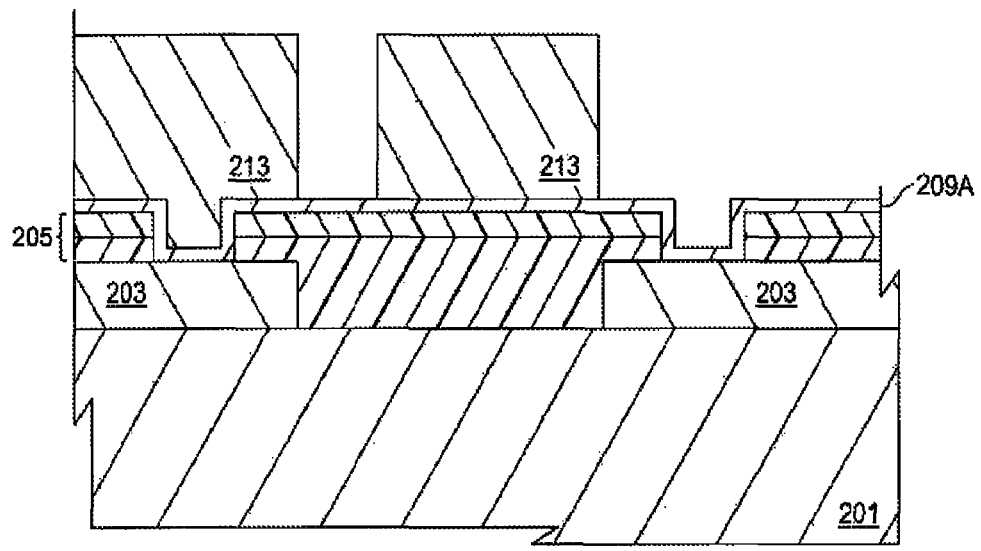
Fig. _2E
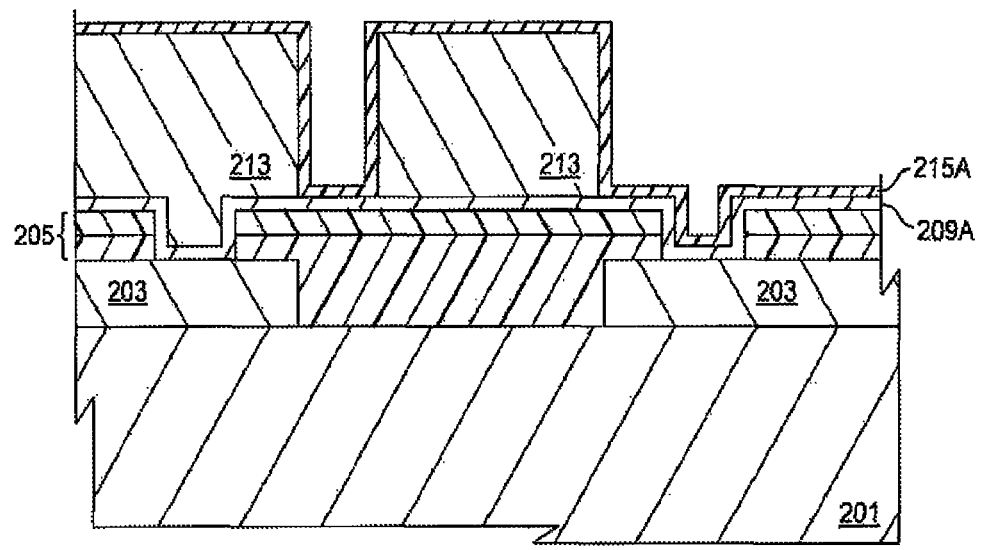
Fig. _2F

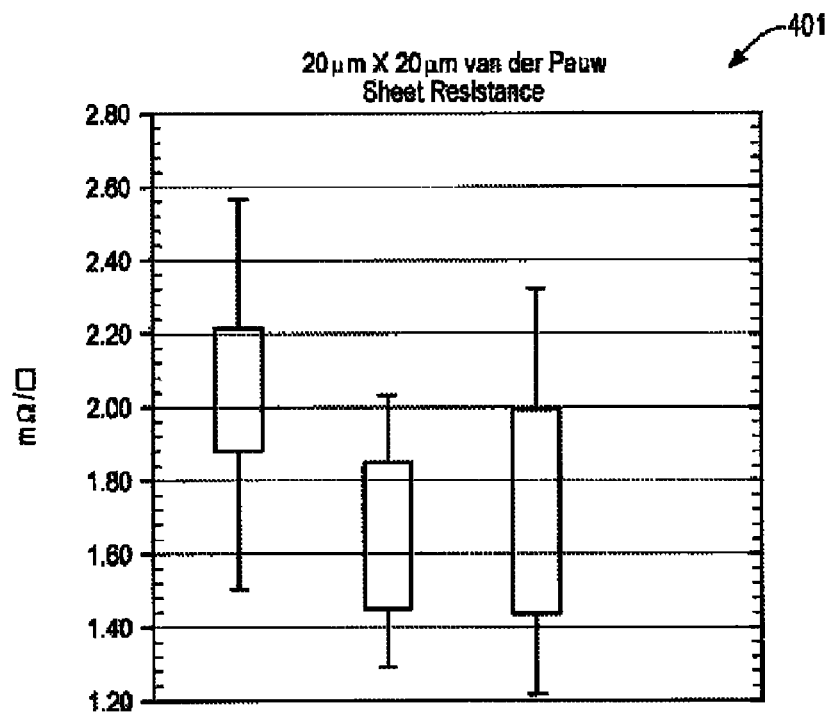
Fig._ 4A *(Prior Art)*
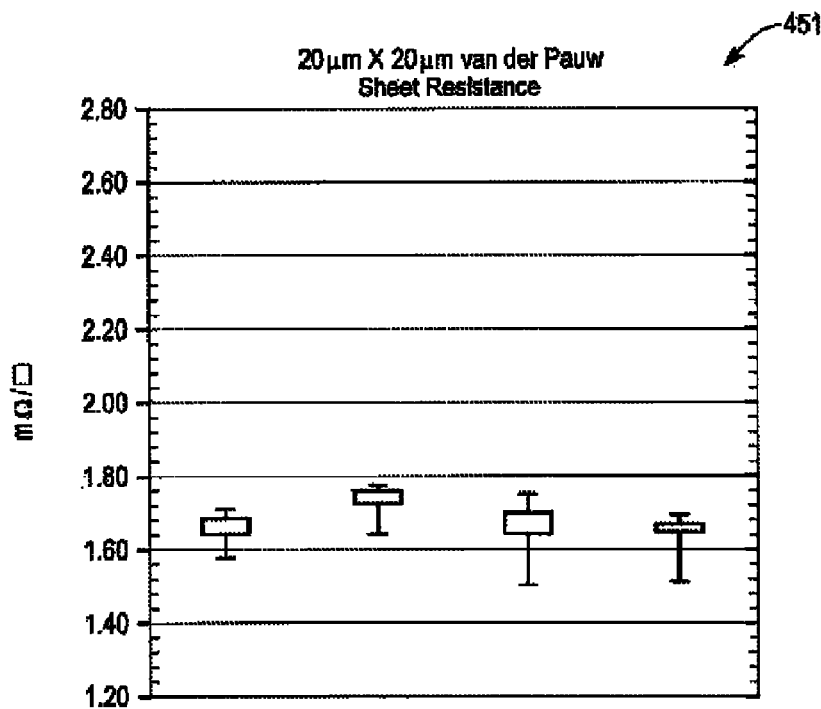
Fig._ 4B

METHOD FOR FABRICATING A THICK COPPER LINE AND COPPER INDUCTOR RESULTING THEREFROM

TECHNICAL FIELD

The present invention relates generally to electronic devices, and more particularly to copper inductors integrated with solid state integrated circuit devices.

BACKGROUND ART

Semiconductor device performance improvements have historically been achieved by reducing device dimensions. The device miniaturization trend has progressed to a point where contemporary ICs are fabricated with deep sub-micron device feature sizes. The trend has placed increased emphasis on miniaturization of discrete passive components that are required to function with miniaturized active devices.

In addition to reduced feature sizes, recent trends have focused on replacing conventional aluminum as the conductive medium with copper. As wire widths in integrated circuits continue to shrink, the electrical conductivity of the wiring material itself becomes increasingly important. In this regard, aluminum which has been the material of choice since the integrated circuit art began, is becoming less attractive than conductors such as gold, silver, and especially copper. Copper is also more resistant than aluminum to electromigration, a quality that grows in importance as wire widths decrease. Copper has found increased application in the creation of discrete components, most notably discrete inductors that are formed above the surface of a semiconductor-based IC. Copper provides advantages of improved conductivity and reliability but does provide a challenge where a layer of copper must be patterned and etched. The process challenge is due partially to the fact that copper does not readily form volatile species during the etching process. To overcome the etch problem, other methods of creating interconnect lines using copper have been proposed including depositing copper patterns using selective electrodes plating.

The speed limit of advanced ICs is set by the delay in signal propagation in conductive interconnect lines, which is determined by the time constant of the line. The time constant is the product of the resistance, R, of the line and the capacitance, C, between the line and all adjacent lines; hence, an RC time constant. Using a lower resistivity conductive material decreases interconnect RC time constant delays resulting in an overall increase in device speed.

Resistance, R, of a structure is determined by the following equation $$R = \frac{\rho L}{WT}$$

where $\rho$ is the resistivity of a conductive material, L is the length of the conductive material, W is the width of the conductive material, and T is the thickness of the conductive material.

The limited availability of low-loss integrated inductor structures has long hindered the development of integrated circuits (IC) such as passive filters, voltage controlled oscillators (VCO), matching networks, and transformers. Contemporary portable communications environments strive to achieve more fully integrated circuits that operate at radio frequency (RF) and microwave frequencies. Recent trends indicate a push to integrate entire receivers onto a single substrate. Planar inductors tend to suffer from high losses and low quality factors (Q factors) at radio frequencies. The losses and low Q factors are generally attributable to dielectric losses incurred from parasitic capacitances and resistive losses due to the use of thin conductors with relatively high resistance. The Q factor is defined as $$Q = \frac{E_s}{E_l},$$

where $E_s$ is energy that is stored in the reactive portion of the component and $E_l$ is energy that is lost in the reactive portion of the component. The Q value of an inductor can also be expressed with the equation $$Q = \frac{\omega_0 L}{R}$$

where $\omega_0$ is the resonant frequency of oscillation of the inductor, L is the inductance value of the inductor and R is the resistance of the inductor. As the equation indicates, for a given value of $\omega_0$, the Q value of the inductor increases as the resistance of the inductor is decreased. As the resistance of the component approaches zero, the Q factor approaches infinity.

For high frequency signals, such as signals in the 10 GHz to 100 GHz range, the value of the Q factor obtained from silicon-based inductors is significantly degraded. For applications in this high frequency range, monolithic inductors have been researched using a base other than silicon for the creation of the inductors. Such monolithic inductor have, for instance, been created using sapphire or GaAs as a base. These inductors have a considerably lower parasitic capacitance than their silicon counterparts and therefore provide higher frequencies of resonance of an LC circuit. Where, however, more complex applications are required, the need still exists to create inductors using silicon as a substrate base.

With reference to FIG. 1, a cross-sectional view of a prior art copper line forms a portion of an integrated inductor. A substrate 101 having a passivation layer 103 is coated with a thin sputtered layer of metal 105, such as titanium-tungsten (TiW), thus forming a barrier layer and providing for adhesion of a subsequent sputtered layer of copper 107. A thick layer of photoresist 109 is then applied using, for example, spin-on techniques, over an uppermost surface of the sputtered copper layer 107. The photoresist 109 is exposed and the exposed portion is removed, leaving behind a trench within which to deposit electroplated copper 111.

The patterned photoresist serves as a mask during the copper electroplating process. During the electroplating step, the top of the substrate 101 and passivation layer 103 conducts plating current through the sputtered layer of metal 105 and sputtered layer of copper 107 beneath the photoresist 109 by connecting a cathode lead (not shown) to the substrate 101 along an edge of the substrate 101. Current flows along the cathode lead from the anode in a copper solution to the substrate 101, depositing a thick layer of electroplated copper 111 along the photoresist trench in the process. Plating times and photoresist thickness control deposited thickness and grain size for the resulting electroplated copper 111.

Once the electroplated copper 111 is deposited, a wet or dry (e.g., plasma) organic strip process is performed to remove the photoresist 109. An additional etch is performed to remove the sputtered metal layer 105 and sputtered copper layer 107 from the top of the passivation layer 103, electrically isolating the inductor. Connections to the ends of the inductor are made through via holes (not shown) in the passivation layer 103 allowing the sputtered and plated metal layers to contact metallization layers (not shown) within the IC.

However, process steps subsequent to electroplating leave rough edges and undercuts on sidewalls of inductors formed from copper. The sidewall roughening is especially deleterious in RF applications where RF performance of the copper inductor depends on the copper wall profile. Therefore, what is needed is a method for producing thick copper lines which may be formed into inductors having smooth and vertical sidewalls.

SUMMARY

In one exemplary embodiment, the present invention is a method of forming one or more inductors and various lines on a substrate. The method includes forming a first dielectric material over the substrate, forming a trench in the first dielectric material, and substantially filling the trench with copper to form the one or more inductors. The first dielectric material is removed and a second dielectric material is formed over the copper. The second dielectric material is removed from an uppermost portion of the copper thus leaving a portion of the second dielectric material on sidewalls of the copper.

In another exemplary embodiment, the present invention is a method of forming one or more inductors on a substrate where the method includes forming a plurality of integrated circuits on the substrate, forming a metal layer over the plurality of integrated circuits, and forming a passivation layer over the metal layer and the plurality of integrated circuits. A plurality of openings is formed in the passivation layer thereby exposing a portion of the metal layer and a copper barrier layer is formed over the passivation layer and the plurality of passivation openings. A first dielectric material is formed over the passivation layer, a trench is formed in the first dielectric material, and the trench is substantially filled with copper to form the one or more inductors. The first dielectric material is removed and a second dielectric material is formed over the copper. The second dielectric material is removed from an uppermost portion of the copper thus leaving a portion of the second dielectric material on sidewalls of the copper and portions of the copper barrier layer contained with the plurality of passivation openings are etched to expose the metal layer.

BRIEF DESCRIPTION OF THE DRAWINGS

FIG. 1 is a cross-sectional view of a copper inductor processed in accordance with the prior art.

FIGS. 2A-2J are cross-sectional views of copper inductor processing steps in accordance with various exemplary embodiments of the present invention.

FIG. 4A is a sheet resistance graph of a copper line formed in accordance with prior art techniques.

FIG. 4B is a sheet resistance graph of a copper line formed in accordance with exemplary techniques in accordance with the present invention.

DETAILED DESCRIPTION

Figure 2G:
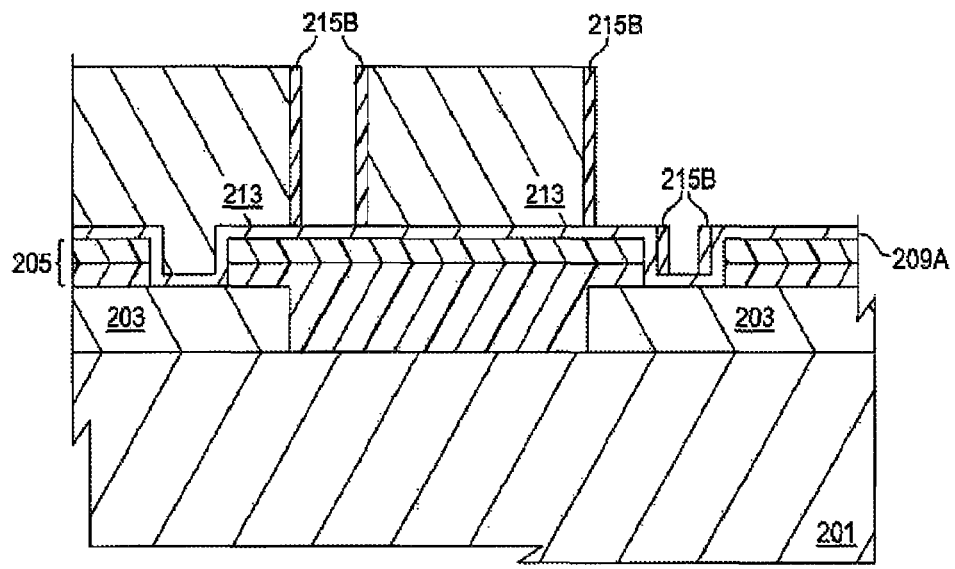

With reference to FIG. 2A, a base substrate 201 is frequently chosen to be a silicon wafer. Alternatively, another elemental group IV semiconductor or compound semiconductor (e.g., groups III-V or II-VI) in either wafer or non-wafer forms may be selected for the base substrate 201. The base substrate 201 has fabricated thereon a plurality of active integrated circuit devices (not shown). Methods of fabrication of the plurality of active integrated circuit devices are known in the art. A top metal layer 203 is fabricated over the active integrated circuit devices to form, for example, bond pads. One or more passivation layers 205 is added to protect underlying device circuitry. At least two passivation openings 207, one for each end of a to-be-formed inductor, are etched through the one or more passivation layers 205 allowing contact with the top metal layer 203. Patterning and etching of the one or more passivation layers 205 may be conducted with fabrication techniques such as photoresist coating, photolithographic exposure, photoresist develop and etch, and passivation layer etching.

In FIG. 2B, a copper barrier/seed layer 209A is deposited. The copper barrier-seed layer 209A is comprised of a diffusion-preventing copper barrier layer and may be followed by a deposited copper seed layer. The copper barrier layer is frequently a single or bi-layer deposition from materials including cobalt-based alloys, ruthenium-based alloys, silicon nitride, silicon-copper-nitride, tantalum, and tantalum nitride. In a specific exemplary embodiment, the copper barrier layer is 300 Å of tantalum followed by a 400 Å to 2000 Å copper seed layer. The copper seed layer is commonly used although ruthenium-based seedless layers are beginning to emerge in the art. If employed, the seed-layer provides a low-resistance conductor for plating current that drives a subsequent electroplating process, and also facilitates film nucleation.

In FIG. 2C, a patterned and etched photoresist layer 211 establishes boundaries for inductor trenches. The inductor trenches serve as basic shapes for inductors formed from one or more copper lines in subsequent steps. For example, planar or multi-level spiral or serpentine inductors may be formed from copper lines formed in accordance with exemplary embodiment disclosed herein. However, unlike the prior art method of copper line formation, there is no need for high critical dimension (CD) biasing since anisotropic etching is employed. The prior art method of formation depends upon isotropic etching. Consequently, great care must be taken in the prior art to consider lateral etching, and lines must therefore be biased accordingly.

An electroplated copper layer 213 is added in FIG. 2D, substantially filling the inductor trench openings located in the patterned and etched photoresist layer 211 (FIG. 2C), using electroplating technology. Growth of the electroplated copper layer 213 is polycrystalline. Grain size within the copper layer 213 is dependent on factors such as texture (i.e., microroughness) of underlying layers, parameters of growth conditions such as temperature, plating voltages, etc., as well as dimensions of trenches to be filled (e.g., dimensions of grooves or vias). In this embodiment of the present invention, the thickness of the electroplated copper layer 213 may be formed close to the final copper target thickness. Formation of the copper layer 213 close to the target thickness contrasts significantly with the prior art. Prior art formation techniques require a plated copper thickness to be greater than the target thickness to compensate for large vertical losses of copper during a subsequent isotropic etch. Details of how the vertical losses are controlled with the present invention are disclosed in detail below.

In a specific exemplary embodiment, smaller sized vias (not shown) may be formed through one or more dielectric layers and filled with copper to interconnect the inductor to the top metal layer 203. Again, a copper barrier layer followed by a copper seed layer may be deposited. A slow bottom-up electroplating may be used to fill the via and have planar copper film in a field area to interconnect with the inductor. The copper used to fill the via will typically be in a thickness range of 1000 Å to 4000 Å.

In FIG. 2E, the patterned and etched photoresist layer 211 is removed. In a specific exemplary embodiment, the copper layer 213 is then annealed at a temperature of 175±25° C. for one to two hours in a nitrogen/hydrogen ($N_2/H_2$) ambient.

Copper annealing has several advantages to overall device performance. First, it transforms the plated Cu and Cu seed into one continuous Cu material through thermal induced grain re-growth. The grain re-growth further reduces the probability of undercut since the Cu seed under the plated Cu becomes morphologically different from the Cu seed in the field area. Copper grain size in the thick Cu line is enlarged which increases electrical conductivity. After an anneal step, a "bamboo structure" of the copper is created wherein the copper grains span the full width of the line. Unless annealed, plated copper lines are not stable and their grain structure continues to change, even under ambient temperatures.

Secondly, annealing removes tension from the plated copper. Dislocations within the plated copper are removed, interface energy is reduced, and structured texture growth along trench walls is reduced. Additionally, in a case of through-holes, via pullout voids are prevented and wall detachments (due to differences in thermal expansion coefficients between adjacent dielectric materials and copper) of copper layers are avoided or greatly reduced.

Additionally, annealed plated copper layers are less susceptible to effects of electromigration. Electromigration is a mass transport effect caused by electrons in electrical current flow colliding with stationary atoms. The collision can push the stationary atoms in the direction of the electron flow. Effects of electromigration are most pronounced in narrow passages (i.e., areas of increased current density) and can lead to a contact void. Circuit paths with a bamboo structure, where grain boundaries along the current flow direction are missing, show increased resistivity to electromigration effects. Prior to SiN deposition an in-situ $NH_3$ plasma treatment may be performed to remove any copper oxide.

With reference to FIG. 2F, a thin silicon nitride ($Si_3N_4$) layer 215A is deposited over the electroplated copper layer 213. In a specific exemplary embodiment, the $Si_3N_4$ layer is 100 Å to 500 Å in thickness. The silicon nitride layer 215A is then etched anisotropically. Anisotropic etches are frequently performed using, for example, a reactive ion etch (RIE) process as known in the art. The anisotropic etch leaves essentially only vertical silicon nitride sidewalls 215B (FIG. 2G) while removing horizontal sections of the silicon nitride layer 215A. Thus, the silicon nitride layer 215A is removed from an uppermost portion of the copper layer 213. The silicon nitride sidewalls 215B protect a profile of the copper layer 213 in subsequent process steps. The silicon nitride sidewalls 215B therefore significantly improve control of the copper line profile and avoid roughening of the sidewall of the copper layer 213, thereby substantially improving RF performance of a resulting inductor. Various combinations of chemicals may be incorporated to increase selectivity of the RIE such that silicon nitride is more readily etched than any adjacent non-silicon nitride layers. Such selectivity enhancements are known in the art.

Figure 2H:
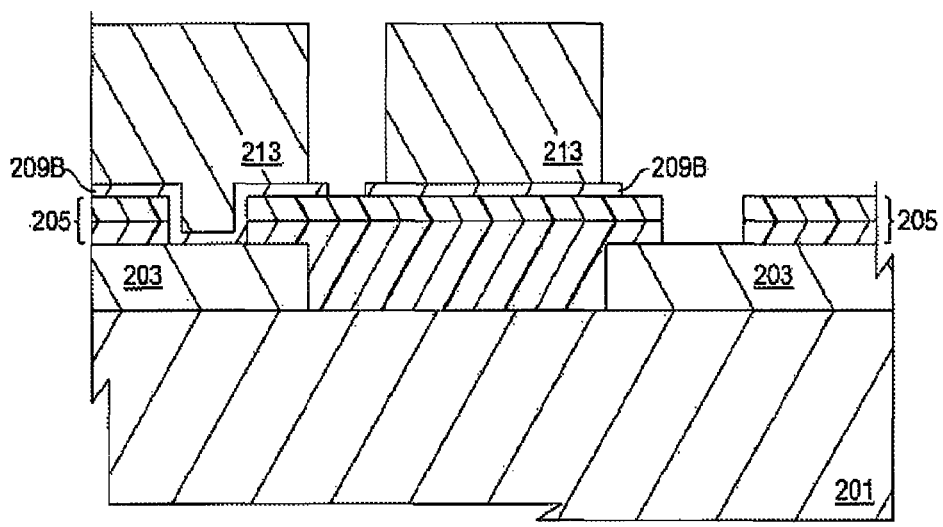

In FIG. 2H, the copper barrier/seed layer 209A is etched leaving an etched copper barrier/seed layer 209B. The vertical silicon nitride sidewalls 215B are then removed by, for example, an isotropic dry silicon nitride etch. Alternatively, in a separate embodiment the seed layer portion of the copper barrier/seed layer 209A may be either wet or dry etched separately. The seed layer portion etch is followed by removal of the vertical silicon nitride sidewalls 215B and then removal of the copper barrier layer portion. In yet another embodiment, the vertical silicon nitride sidewalls 215B are not removed but simply left in place.

Figure 2I:
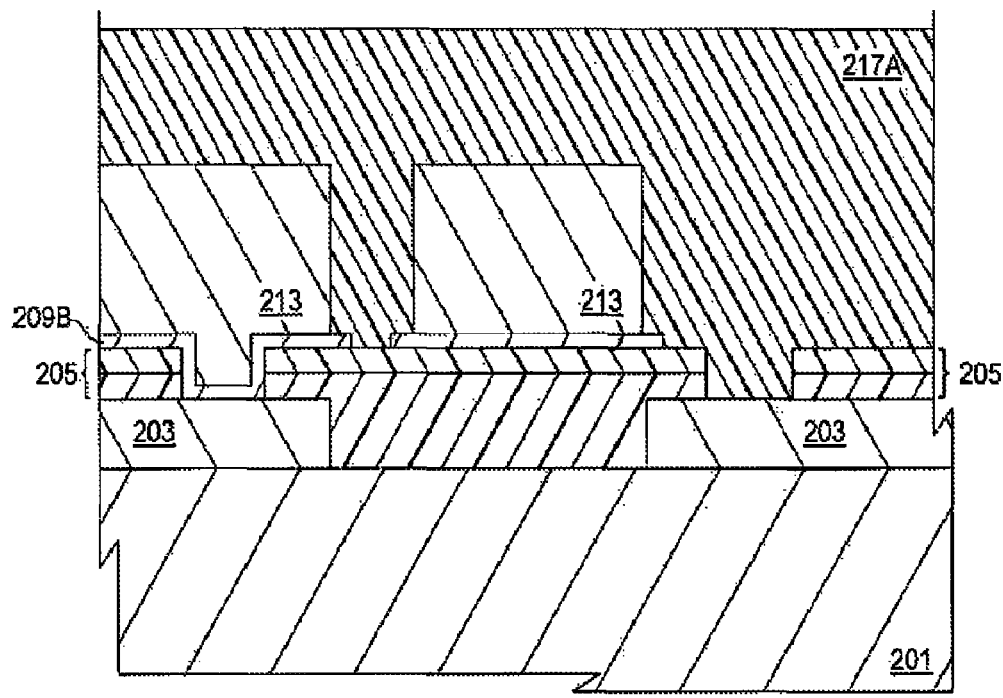
Figure 2J:
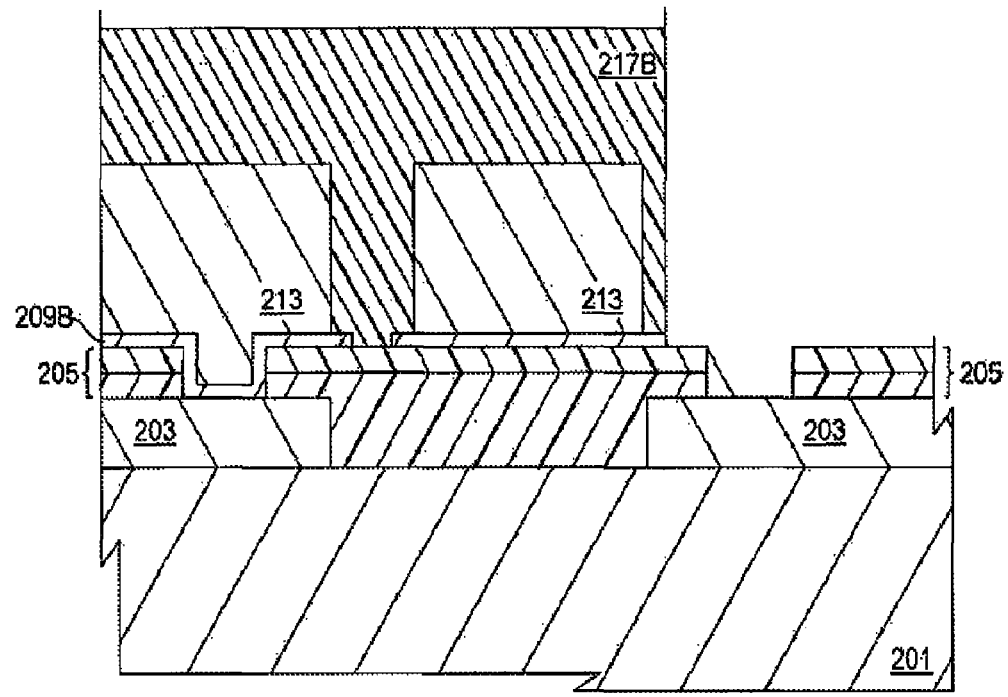

In FIG. 2I, a photosensitive dielectric layer 217A is formed, for example, by spin coating, over the copper layer 213 and other exposed layers. The photosensitive dielectric layer 217A could be comprised of a variety of materials including polyimide, Dow Bisbenzocyclotene (BCB™), or ROHM Hass Intervia™. Each of these materials has a low dielectric constant (i.e., less than 3) and passivate the Cu line against oxidation or moisture absorption and damage without degrading RF performance of the inductor. In a specific exemplary embodiment, the photosensitive dielectric layer 217A is ROHM Hass Intervia™. The photosensitive dielectric layer 217A is baked, exposed, and developed, leaving an etched photosensitive dielectric layer 217B (FIG. 2J) which is then cured. The etched and cured photosensitive dielectric layer 217B protects the copper layer 213 which comprises the formed inductor and allows contact to be made to the top metal layer for back-end-of-line processes such as wire bond operations and packaging, thus completing the integrated circuit.

Figure 3A:
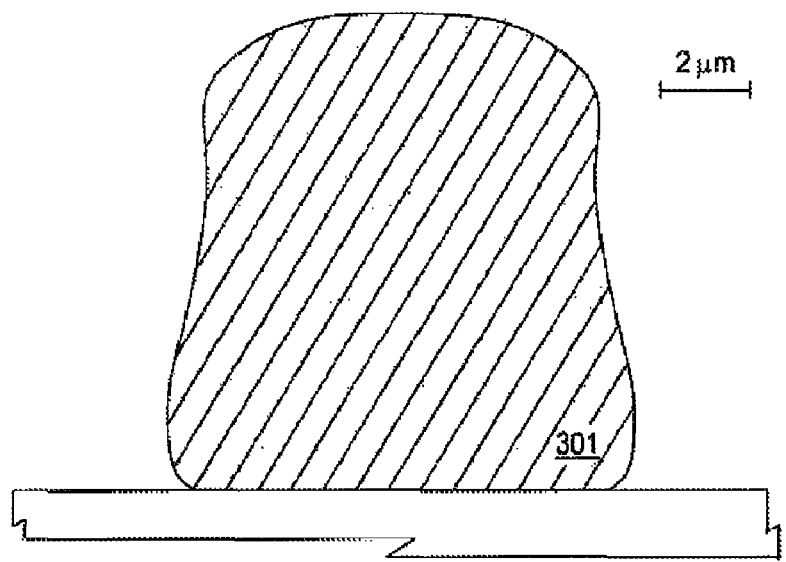
FIG. 3A is a cross-sectional view of a copper line used in forming an inductor and formed in accordance with prior art techniques.
Figure 3B:
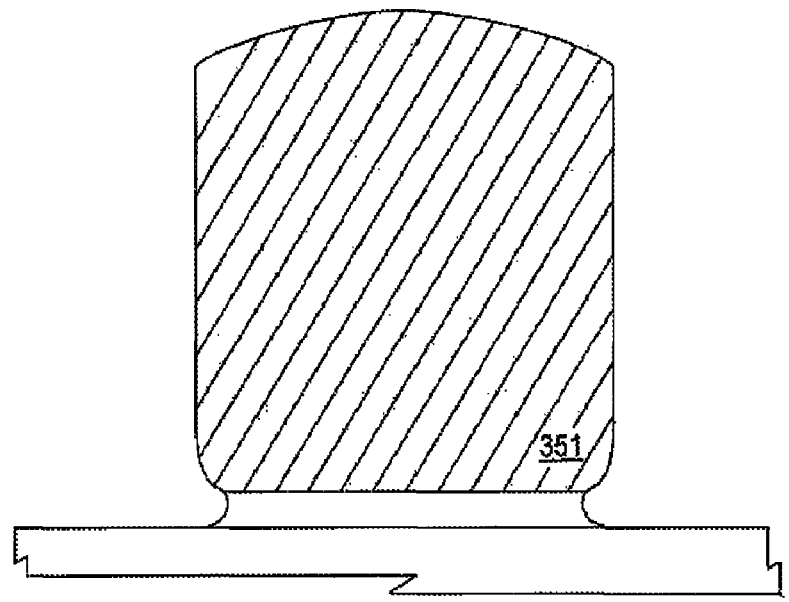
FIG. 3B is a cross-sectional view of a copper line used in forming an inductor and formed in accordance with exemplary techniques of the present invention.

FIGS. 3A and 3B compare cross-sectional views of a prior art copper line profile 301 used in forming an inductor produced in accordance with prior art techniques with a copper line profile 351 formed in accordance with embodiments of the present invention. The prior art copper line profile 301 displays large lateral undercuts due to a lack of sidewall protection during processing. Additionally, sidewalls of the prior art copper line 301 are non-vertical and roughened (roughening along a length of the line is not shown). Both the non-vertical sidewalls and the roughened nature of the sidewalls are also caused by the lack of sidewall protection.

In contrast, the second copper line profile 351 displays little or no lateral undercutting and a near-vertical copper sidewall. The near-vertical nature of the sidewall is limited only by a profile of the patterned and etched photoresist layer 211 (FIG. 2C) used in forming the electroplated copper layer 213. The thin silicon nitride layer 215A/215B (FIG. 2F-2G) protects the electroplated copper layer 213 during subsequent process steps preventing etching and roughening of the copper sidewalls.

Copper line sheet resistance measurements illustrate a further benefit of the present invention. FIGS. 4A and 4B compare a sheet resistance graph of a prior art copper line 401 with a sheet resistance graph of a copper line formed in accordance with exemplary techniques in accordance with the present invention 451. Each graph is taken from a ver der Pauw 20 μm×20 μm measurement. As illustrated, a significant improvement occurs in lot-to-lot control of copper line sheet resistance with a copper line formed using various embodiments of the present invention.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that many types of deposition technology, such as sputtering, chemical vapor deposition (CVD), physical vapor deposition (PVD), electron beam evaporation (EBE), electrochemical deposition (ECD) and others may readily be employed for various layers described. Further, the substrate type may be selected based upon an intended use of a finalized product. For example, an ASIC used as an integrated circuit for a computer may be formed on a silicon wafer. An RF integrated circuit used for lightweight applications or flexible circuit applications, such as a cellular telephone or personal data assistant (PDA), may form the integrated circuit on a polyethyleneterephthalate (PET) substrate deposited with silicon dioxide and polysilicon followed by an excimer laser annealing (ELA) anneal step. Skilled artisans will appreciate that other types of semiconducting and insulating materials other than those listed may be employed. Additional particular process fabrication and deposition techniques, such as low pressure chemical vapor deposition (LPCVD), ultra-high vacuum CVD (UHCVD), and low pressure tetra-ethoxysilane (LPTEOS) may be readily employed for various layers and still be within the scope of the present invention. Although the exemplary embodiments describe particular types of dielectric and semiconductor materials, one skilled in the art will realize that other types of materials and arrangements of materials may also be effectively utilized and achieve the same or similar advantages. The specification and drawings are, accordingly, to be regarded in an illustrative rather than a restrictive sense.

What is claimed is:

1. A method of forming one or more inductors on a substrate, the method comprising:
    forming a plurality of integrated circuits on the substrate;
    forming a metal layer over the plurality of integrated circuits;
    forming a passivation layer over the metal layer and the plurality of integrated circuits;
    forming a plurality of openings in the passivation layer thereby exposing a portion of the metal layer;
    forming a copper barrier layer over the passivation layer and the plurality of passivation layer openings;
    forming a photoresist layer over the copper barrier layer;
    anisotropically etching the photoresist layer to form at least one trench;
    substantially filling the at least one trench with a copper material to form a copper layer having at least one inductor portion, each inductor portion having an uppermost portion;
    removing the photoresist layer;
    annealing the copper layer;
    forming a dielectric material over the copper layer;
    removing horizontal sections of the dielectric material including the dielectric material from the uppermost portion of each inductor portion of the copper layer thus leaving a vertical portion of the dielectric material on sidewalk of each inductor portion; and
    etching through portions of the copper barrier layer contained within the plurality of passivation layer openings to expose the metal layer.

2. The method of claim 1 further comprising forming a copper seed layer over the copper barrier layer prior to the step of substantially filling the at least one trench with the copper material.

3. The method of claim 1 wherein the dielectric layer is silicon nitride.

4. The method of claim 1 wherein the at least one trench is formed in a spiral pattern.

5. The method of claim 1 wherein the at least one trench is formed in a serpentine pattern.

6. The method of claim 1, wherein the copper layer is annealed at a temperature of between about 150° C. and about 200° C. in a nitrogen/hydrogen ambient.

7. A method of forming one or more inductors on a substrate, the method comprising:
    forming a photoresist layer over the substrate;
    anisotropically etching the photoresist layer to form a trench;
    substantially filling the trench with a copper material;
    removing the photoresist layer;
    annealing the copper material;
    forming a thin silicon nitride layer, wherein the silicon nitride layer ranges from 100 angstroms to 500 angstroms in thickness over the copper material; and
    removing horizontal sections of the thin silicon nitride layer to expose an uppermost portion of the copper material and thus to leave vertical portions of the thin silicon nitride layer on sidewalk of the copper material, the vertical portions having a thickness within a range from 100 to 500 angstroms.

8. A method of forming one or more inductors on a substrate, the method comprising:
    forming a photoresist layer over the substrate;
    anisotropically etching the photoresist layer to form at least one trench in the photoresist layer;
    substantially filling the at least one trench with a copper material to form a copper layer having at least one inductor portion, each inductor portion having an uppermost portion;
    removing the photoresist layer;
    annealing the copper layer;
    forming a dielectric material over the copper layer;
    removing horizontal sections of the dielectric material including removing the dielectric material from the uppermost portion of each inductor portion of the copper layer thus leaving vertical portions of the dielectric material sidewalls of each inductor portion
    forming a Ruthenium-based seedless layer on the substrate before forming the photoresist layer, the Ruthenium-based seedless layer to form a copper barrier layer;
    wherein the photoresist layer is formed over the Ruthenium-based seedless layer; and
    wherein substantially filling the at least one trench comprises electroplating the Ruthenium-based seedless layer to grow copper layers within the at least one trench.

9. The method of claim 8, wherein the copper layer is annealed at a temperature of between about 150° C. and about 200° C. in a nitrogen/hydrogen ambient.

10. The method of claim 8 wherein the at least one trench is formed by patterning and etching the photoresist layer.

11. The method of claim 8 wherein the dielectric material is silicon nitride.

12. The method of claim 8 wherein the at least one trench is formed in a spiral pattern.

13. The method of claim 8 wherein the at least one trench is formed in a serpentine pattern.

14. A method of forming one or more inductors on a substrate, the method comprising:
    forming a photoresist layer over the substrate;
    anisotropically etching the photoresist layer to form at least one trench in the photoresist layer;

substantially filling the at least one trench with a copper material to form a copper layer having at least one inductor portion, each inductor having an uppermost portion;
removing the photoresist layer;
annealing the copper layer;
forming a dielectric material over the copper layer;
removing horizontal sections of the dielectric material including removing the dielectric material from the uppermost portion of each inductor portion of the copper layer thus leaving vertical portions of the dielectric material sidewalls of each inductor portion forming a copper barrier layer on the substrate before forming the photoresist layer;
forming a copper seed layer having a thickness from 400 angstroms to 2000 angstroms on the substrate;
wherein the photoresist layer is formed on the copper seed layer; and
wherein substantially filling the at least one trench comprises electroplating the copper seed layer to grow copper layers within the at least one trench.

\* \* \* \* \*

UNITED STATES PATENT AND TRADEMARK OFFICE
CERTIFICATE OF CORRECTION

PATENT NO.         : 7,776,705 B2                                             Page 1 of 1
APPLICATION NO. : 11/470552
DATED              : August 17, 2010
INVENTOR(S)        : Isaiah O. Oladeji et al.

It is certified that error appears in the above-identified patent and that said Letters Patent is hereby corrected as shown below:

In column 7, line 58, in Claim 1, delete "sidewalk" and insert -- sidewalls --, therefor.

In column 8, line 23, in Claim 7, delete "sidewalk" and insert -- sidewalls --, therefor.

In column 8, line 42, in Claim 8, after "material" insert -- on --.

In column 9, line 3, in Claim 14, after "inductor" insert -- portion --.

Signed and Sealed this

Twenty-third Day of November, 2010

David J. Kappos
*Director of the United States Patent and Trademark Office*